United States Patent
Jongbloed et al.

(10) Patent No.: US 9,799,509 B2
(45) Date of Patent: Oct. 24, 2017

(54) CYCLIC ALUMINUM OXYNITRIDE DEPOSITION

(71) Applicant: ASM IP Holding B.V., Almere (NL)

(72) Inventors: Bert Jongbloed, Oud-Heverlee (BE); Dieter Pierreux, Dilbeek (BE); Werner Knaepen, Leuven (BE)

(73) Assignee: ASM IP HOLDING B.V. (NL)

( * ) Notice: Subject to any disclaimer, the term of this patent is extended or adjusted under 35 U.S.C. 154(b) by 0 days.

(21) Appl. No.: 14/555,429

(22) Filed: Nov. 26, 2014

(65) Prior Publication Data

US 2016/0148805 A1    May 26, 2016

(51) Int. Cl.
*H01L 21/02* (2006.01)
*H01L 21/308* (2006.01)

(52) U.S. Cl.
CPC .... *H01L 21/02178* (2013.01); *H01L 21/0228* (2013.01)

(58) Field of Classification Search
CPC .......................... H01L 21/02178; H01L 29/518
USPC .......................................................... 438/591
See application file for complete search history.

(56) References Cited

U.S. PATENT DOCUMENTS

| | | | |
|---|---|---|---|
| 6,506,676 B2 | 1/2003 | Park et al. | |
| 6,759,081 B2 | 7/2004 | Huganen et al. | |
| 6,900,455 B2 * | 5/2005 | Drewes | B82Y 25/00 257/295 |
| 7,595,010 B2 | 9/2009 | Chakravarti et al. | |
| 7,776,763 B2 * | 8/2010 | Reid | C23C 16/303 438/778 |
| 8,097,300 B2 | 1/2012 | Clark | |
| 8,110,491 B2 | 2/2012 | Harada | |
| 8,114,763 B2 | 2/2012 | Forbes et al. | |
| 2004/0129969 A1 * | 7/2004 | Colombo | H01L 21/28194 257/310 |

(Continued)

FOREIGN PATENT DOCUMENTS

KR          14-141521          12/2014

OTHER PUBLICATIONS

Huang et al., "ALD-grown Ultrathin AlN Film for Passivation of AlGaN/GaN HEMTs", CS MANTECH Conference, Apr. 23-26, 2012, Boston, Massachusetts, USA, 4 pages.

(Continued)

*Primary Examiner* — Moazzam Hossain
(74) *Attorney, Agent, or Firm* — Knobbe, Martens, Olson & Bear LLP

(57) ABSTRACT

A process for depositing aluminum oxynitride (AlON) is disclosed. The process comprises subjecting a substrate to temporally separated exposures to an aluminum precursor and a nitrogen precursor to form an aluminum and nitrogen-containing compound on the substrate. The aluminum and nitrogen-containing compound is subsequently exposed to an oxygen precursor to form AlON. The temporally separated exposures to an aluminum precursor and a nitrogen precursor, and the subsequent exposure to an oxygen precursor together constitute an AlON deposition cycle. A plurality of AlON deposition cycles may be performed to deposit an AlON film of a desired thickness. The deposition may be performed in a batch process chamber, which may accommodate batches of 25 or more substrates. The deposition may be performed without exposure to plasma.

21 Claims, 10 Drawing Sheets

(56) References Cited

U.S. PATENT DOCUMENTS

| | | | |
|---|---|---|---|
| 2005/0070126 A1* | 3/2005 | Senzaki | C23C 16/029 438/785 |
| 2007/0237698 A1* | 10/2007 | Clark | C23C 16/34 423/263 |
| 2007/0259534 A1* | 11/2007 | Reid | C23C 16/303 438/783 |
| 2008/0032465 A1* | 2/2008 | Ahn | C23C 16/308 438/142 |
| 2008/0057659 A1* | 3/2008 | Forbes | C23C 16/0227 438/381 |
| 2008/0079111 A1* | 4/2008 | Clark | C23C 16/308 257/506 |
| 2008/0081113 A1* | 4/2008 | Clark | C23C 16/308 427/255.394 |
| 2008/0121962 A1* | 5/2008 | Forbes | C23C 16/308 257/310 |
| 2008/0176108 A1* | 7/2008 | Cheng | C23C 14/024 428/814 |
| 2011/0042200 A1* | 2/2011 | Wilby | C23C 14/0036 204/192.15 |
| 2011/0083735 A1 | 4/2011 | Park et al. | |
| 2012/0045659 A1* | 2/2012 | Chang | C23C 14/0036 428/654 |
| 2012/0181659 A1* | 7/2012 | Wang | H01L 28/56 257/532 |
| 2012/0207948 A1* | 8/2012 | Lee | C23C 16/308 427/569 |
| 2013/0140605 A1* | 6/2013 | Ramdani | H01L 21/28264 257/192 |
| 2013/0337660 A1* | 12/2013 | Ota | C23C 16/308 438/786 |
| 2014/0357090 A1 | 12/2014 | Knaepen et al. | |
| 2015/0179582 A1* | 6/2015 | Baek | H01L 23/53238 257/751 |

OTHER PUBLICATIONS

Mayer et al. "Mechanism of Nucleation and Atomic Layer Growth of AlN on Si", American Chemical Society, vol. 3, pp. 641-646; 1991.

* cited by examiner

CYCLIC ALUMINUM OXYNITRIDE DEPOSITION

FIELD

The invention relates to the manufacture of semiconductor devices and, more particularly, the deposition of aluminum oxynitride.

BACKGROUND

Aluminum nitride (AlN) films have a variety of uses in the manufacture of semiconductor devices. For example, AlN films may be used as hard masks for patterning underlying materials and may also be used as a constituent part in final integrated circuit structures. Various physical and electrical properties of AlN films, however, can limit their usefulness in some applications. For example, AlN films can have a high level of film stress, which can limit their compatibility with "soft" underlying materials. In addition, AlN films can have high leakage current, which can limit their use as a dielectric material in some electronic structures. Consequently, there is a continuing need for processes to deposit AlN-based films with improved physical and electrical properties.

SUMMARY

In accordance with one aspect, a method for integrated circuit fabrication is provided. The method comprises forming an AlON film on a substrate. The AlON film is formed by performing a plurality of aluminum and nitrogen deposition cycles to form an aluminum and nitrogen-containing compound and exposing the aluminum and nitrogen-containing compound to an oxygen precursor. Each aluminum and nitrogen deposition cycle comprises exposing the substrate to an aluminum precursor, and subsequently exposing the substrate to a nitrogen precursor.

In accordance with another aspect, a method for integrated circuit fabrication comprises subjecting a substrate to temporally separated exposures of an aluminum precursor and a nitrogen precursor to form an aluminum and nitrogen-containing compound on the substrate. The aluminum and nitrogen-containing compound is subsequently exposed to an oxygen precursor. Subjecting the substrate and subsequently exposing are repeated to form AlON.

In some embodiments, the AlON is formed in a batch process chamber, preferably a hot wall batch process chamber. The AlON formation may be accomplished without exposing the substrate to plasma. In some embodiments, a ratio of exposures of the substrate to the oxygen precursor and the nitrogen precursor is about 1:6 or less, including about 1:10 or less. In some embodiments, the exposure to the oxygen precursor may comprise subjecting the substrate to temporally separated exposures to an aluminum precursor and the oxygen precursor.

The AlON film may be deposited on a "soft material", including spin-coated materials such as photoresist. In some embodiments, the AlON film may be used as a hard mask for patterning processes. Advantageously, the AlON may have a low leakage current density and may be used as part of a final integrated circuit structure.

DETAILED DESCRIPTION

Figure 1:
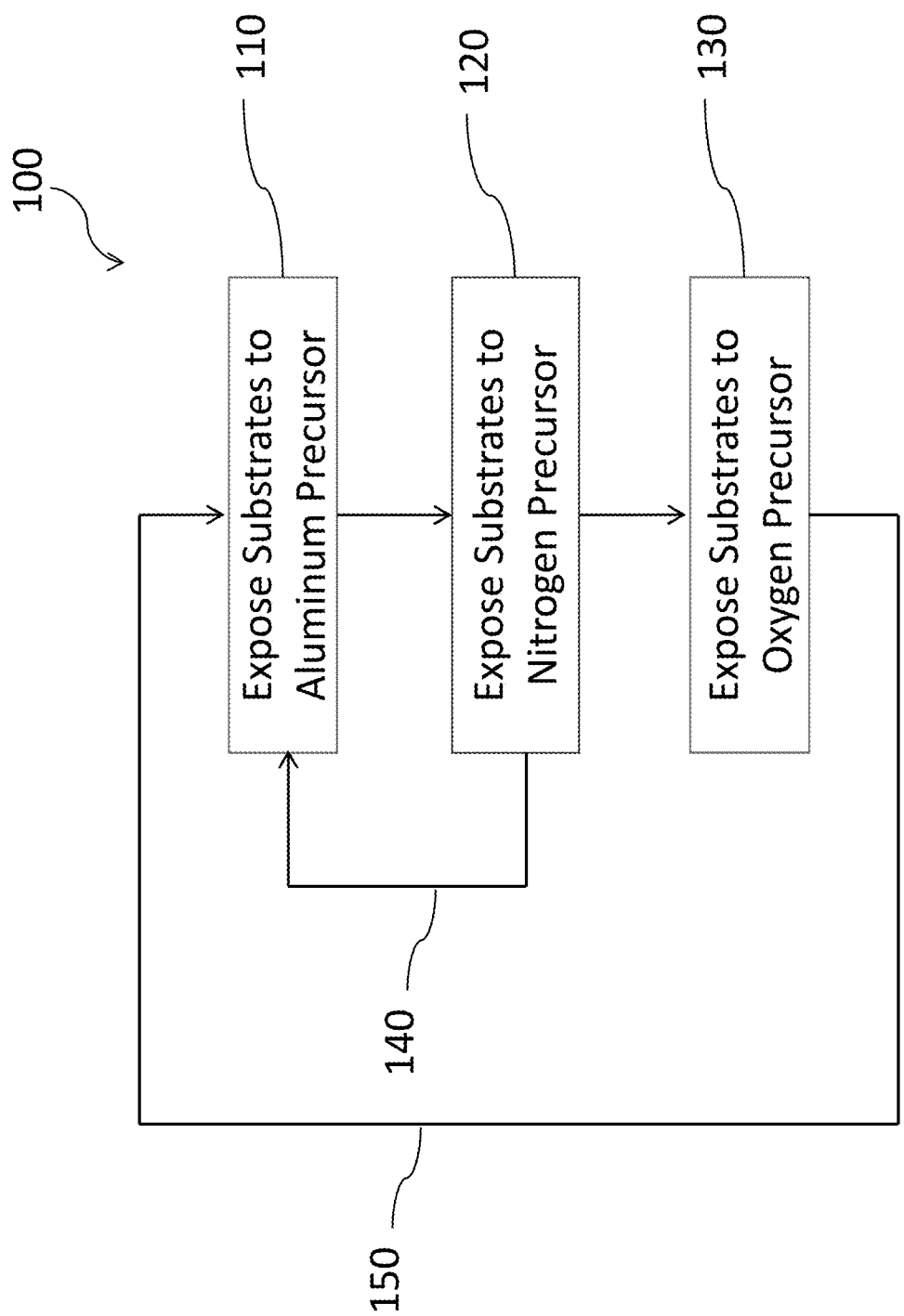
FIG. 1 is a flow chart generally illustrating a process for forming an AlON film, according to some embodiments.

It has been found that the incorporation of oxygen into an AlN layer can advantageously form an AlON film with superior properties, relative to AlN only films. As used herein, an "AlON" film is formed of the elements aluminum, oxygen, and nitrogen. The relative ratios of these elements may be varied, as disclosed herein, to adjust the physical and electrical properties of the AlON film. The AlON film may also be referred to as an aluminum oxynitride film.

In some embodiments, a substrate is subjected to temporally separated exposures to an aluminum precursor and a nitrogen precursor to form an aluminum and nitrogen-containing compound (e.g., AlN) on the substrate. The aluminum and nitrogen-containing compound is subsequently exposed to an oxygen precursor to form AlON. In some embodiments, the exposure to the oxygen precursor may include temporally separated exposures to an aluminum precursor and an oxygen precursor. The temporally separated exposures to an aluminum precursor and a nitrogen precursor, and the subsequent exposure to an oxygen precursor together constitute an AlON deposition cycle. A plurality of AlON deposition cycles may be performed to deposit an AlON film of a desired thickness.

The AlON deposition may be performed in a batch process chamber, which may accommodate batches of 25 or more substrates. Preferably, the deposition is a non-plasma deposition, performed without exposing the substrate to plasma during the deposition.

It will be appreciated that the exposure of the substrate to aluminum and nitrogen precursors before exposure to the oxygen precursor effectively allows the formation of an AlN film, which is then exposed to an oxygen precursor to form AlON. Without being limited by theory, it is believed that the reverse order (exposure to oxygen precursor before exposure to nitrogen precursor) would form AlO first, which would make incorporation of nitrogen difficult, due to the higher strength of the Al—O bond relative to the Al—N bond. Nitrogen-precursor exposure before oxygen-precursor exposure is believed to facilitate the formation of advantageously relatively high amounts of nitrogen in the AlON film. In some embodiments, before the exposure to the oxygen precursor, a plurality of cycles of the temporally separated exposures to an aluminum precursor and a nitrogen precursor are performed. The amount of oxygen in the AlON film may be adjusted by changing the ratio of the oxygen precursor exposures to the cycles of the temporally separated exposures to the aluminum precursor and the nitrogen precursor.

Advantageously, the properties of the AlON film can be tuned by changing the amount of oxygen in the AlON film, as discussed herein. It will be appreciated that increasing the level of oxygen in the AlON film can reduce film stress, refractive index, and leakage current density, and suppress crystallinity so as to form an amorphous film. For example, in some embodiments, the AlON film may have a film stress of about 800 MPa or less, about 200-700 MPa, or about 200-500 MPa. The AlON film may also have a low leakage current density, for example, a leakage current density of less than about $1 \times 10^{-7}$ A/cm$^2$ with an applied electric field of about 2 mV/cm, or less than about $1 \times 10^{-7}$ A/cm$^2$ with an applied electric field of about 5 mV/cm. Advantageously, the above-noted physical and electrical properties are present in the AlON film as deposited; for example, an anneal is not required to achieve these properties.

In some embodiments, the low film stress allows the AlON film to be deposited directly on a "soft" underlying material, such as photoresist. In some embodiments, the AlON film may be used as a hard mask. In this regard, the AlON film provides excellent etch selectively over materials that are easily etched with fluorine-based chemistries, with the high proportion of nitrogen in the film allowing a high resistance of the AlON film against fluorine-based etch chemistries. In some embodiments, the AlON may be patterned and retained as a constituent part of a final integrated circuit device.

Reference will now be made to the Figures, in which like numerals refer to like features throughout.

FIG. 1 is a flow chart generally illustrating a process 100 for forming an AlON film, according to some embodiments. The process 100 is preferably performed in the process chamber of a batch reactor, which may accommodate a plurality of substrates, for example, 25 or more substrates, or 25 to 150 substrates. In some embodiments, the batch process chamber is a hot wall chamber, in which the walls of the chamber are actively heated to, e.g., a process temperature. As noted herein, such a hot wall process chamber may provide advantages for achieving uniform process results. The substrates processed in the batch process chamber may be any workpiece upon which AlN is to be deposited, including a workpiece formed of a semiconductor, such as a semiconductor wafer. Alternatively, the process may be performed in a hot wall single wafer reactor with similar results but with correspondingly lower throughput.

Before being exposed to deposition precursors, a plurality of substrates is loaded into the batch process chamber. The substrates may be heated to a deposition temperature of about 400° C. or less, about 150° C. to about 375° C., about 240° C. to about 375° C., or about 300° C. to about 375° C. In addition, a deposition pressure may be established in the batch process chamber, the deposition pressure being about 50 mTorr to about 900 mTorr, about 100 mTorr to about 700 mTorr, or about 150 mTorr to about 550 mTorr.

At block 110, the substrates may be exposed to an aluminum precursor, for example, in an aluminum precursor pulse. In some embodiments, the flow of the aluminum precursor into the process chamber starts at the beginning of the pulse and terminates at the end of the pulse. In some embodiments, the pulse duration may be about 1 seconds or more, about 1 second to about 20 seconds, about 2 seconds to about 20 seconds, about 3 seconds to about 16 seconds, or about 5 seconds to about 10 seconds. Without being limited by theory, it is believed that durations on the order of seconds, including 2 or 3 seconds or more, are desirable to achieve a high level of self-limiting coverage of a substrate surface with the aluminum precursor. However, excessively long durations may result in reaction of individual aluminum precursor molecules with other aluminum precursor molecules, causing an undesired non-self-limiting deposition. The aluminum precursor pulse duration may be less than about 20 seconds, or less than about 16 seconds, or about 7 seconds in some embodiments.

Examples of aluminum precursors include organic aluminum precursors, such as alkyl aluminum compounds and alkyl-substituted aluminum chloride compounds, and alkyl-substituted aluminum hydride compounds. The organic aluminum precursor may have the formula AlR$_3$, wherein the R is selected from substituted, branched, linear or cyclic C1-C10 hydrocarbons. In some embodiments 0-3 of the R groups are methyl and the rest are ethyl. In some embodiments, the organic aluminum precursor may be trimethylaluminum (TMA). In some embodiments, the aluminum precursor has both a halide ligand and organic ligand, for example AlR$_x$X$_{3-x}$, wherein x is from 1 to 2 and R is organic ligand, such as alkyl or alkenyl and X is halide, such as chloride. Examples of this kind of aluminum precursor might be, for example, dimethylaluminumchloride (CH$_3$)$_2$AlCl. In some other embodiments the aluminum precursor is an Al halide, such as AlCl$_3$ or AlI$_3$.

After terminating the aluminum precursor pulse, at block 120, the substrates may be exposed to a nitrogen precursor in a nitrogen precursor pulse. Examples of nitrogen precursors include ammonia, hydrazine, and hydrazine derivatives. In some embodiments, the flow of the nitrogen precursor into the process chamber starts at the beginning of the pulse and completely terminates at the end of the pulse. In some embodiments, the pulse duration may be about 1 second or more, or about 10 seconds or more. In some embodiments, the pulse duration may be about 1 second to about 90 seconds, about 10 second to about 90 seconds, or about 20 seconds to about 60 seconds. Without being limited by theory, it believed that durations of about 10 seconds or more desirably allow the nitrogen precursor to fully react with the aluminum precursors on the substrate surface. Longer durations can increase the deposited film thickness.

With continued reference to FIG. 1, the blocks 110 and 120 constitute a deposition cycle 140. The deposition cycle may be repeated a plurality of times to form an aluminum nitride (AlN) film of a desired thickness. It will be appreciated that the film may completely cover the substrate, or may be localized at discrete locations on the substrate, depending on, for example, the reactivity of the aluminum precursor with different regions on the substrate surface.

It will be appreciated that the cycle 140 can include one or more precursor removal steps (not illustrated). For example, between blocks 110 and 120, aluminum precursor can be removed or purged from the proximity of the substrates by, e.g., flowing inert gas into the process chamber without flowing precursor species and/or by evacuating the process chamber to remove the aluminum precursor from the chamber.

Similarly, after block 120 and before again exposing the substrate to aluminum precursor, the nitrogen precursor can be removed from the proximity of the substrates. This may also be accomplished by, e.g., flowing inert gas into the process chamber without flowing precursors species and/or by evacuating the process chamber to remove the nitrogen precursor from the chamber. Thus, in some embodiments, an AlN deposition cycle 140 may include:

Exposing substrates to an aluminum precursor pulse;
Removing the aluminum precursor from the process chamber;
Exposing substrates to a nitrogen precursor pulse; and
Removing the nitrogen precursor from the process chamber.

The precursor removal times for the aluminum and nitrogen precursors may be the same or different. In some embodiments, the aluminum precursor purge time is about 1 to about 7 seconds and the nitrogen precursor purge time is about 7 to about 30 seconds, or about 7 to about 15 seconds. It has been found that the duration of the aluminum precursor purge does not strongly influence film uniformity, but the duration of the nitrogen precursor purge does more strongly influence film uniformity. In some embodiments, the duration of the nitrogen precursor purge is at least about 1.5, about 2, or about 3 times the duration of the aluminum precursor purge.

As noted herein, the deposition cycles can be repeated to form an AlN film of a desired thickness. In some embodiments, all cycles may be performed under the same conditions, e.g., the same deposition temperature and/or pressure. In some other embodiments, the conditions for performing a first set of one or more deposition cycles during a first time period can be different from the conditions for performing a second set of one or more deposition cycles during a second time period.

In some embodiments, the deposition temperature for a first set of AlN deposition cycles is higher than for a second set of deposition cycles. Without being limited by theory, it is believed that the deposition rate of the AlN film is strongly dependent upon the surface that the film is deposited upon. It has been found that the AlN film deposition rate increases after performing an initial set of deposition cycles and it is believed that this lower initial rate is due to the presence of an inhibition period which disappears once a closed AlN film is formed on the substrate surface. Increasing the deposition temperature during this inhibition period can increase the deposition rate, while maintaining high film uniformity. In some embodiments, the deposition temperature during a first period of performing the deposition cycles is at least about 25° C. higher, at least about 25° C. to about 75° C. higher, or at least about 25° C. to about 50° C. higher than the deposition temperature during a subsequent period of performing the deposition cycles. In some embodiments, the deposition temperature during the first period is about 350° C.±about 25° C., or about 350° C.±about 10° C., and the deposition temperature during the second period is about 300° C.±about 25° C., or about 300° C.±about 10° C. In some embodiments, the first period may include about 10 or more deposition cycles, about 10 to about 50 deposition cycles, or about 20 to about 40 deposition cycles.

It has also been found that the AlN deposition rate becomes less influenced by the pulse duration of the nitrogen precursor after passing the inhibition period. In some embodiments, the nitrogen precursor pulse duration can decrease over time. For example, nitrogen precursor pulse durations in the first period of performing the deposition cycles can be higher than in the second period, e.g., the period after passing the inhibition period. For example, the nitrogen precursor pulses times during the first period may be about 10 seconds or more, falling to about 3 to about 10 seconds or about 3 to about 5 seconds in the second period.

Advantageously, AlN films deposited according to some embodiments can have exceptional uniformity across a substrate, which facilitates the ultimate formation of a highly uniform AlON film. In some embodiments, a film non-uniformity of $1\sigma=1\%$ or better, $1\sigma=0.5\%$ or better, or $1\sigma=0.25\%$ or better is achieved across the substrate.

With continued reference to FIG. 1, at block 130, the substrates may be exposed to an oxygen precursor. Examples of oxygen precursors include water (e.g., water vapor), oxygen gas, and ozone. In some embodiments, the substrates are exposed to a pulse of an oxygen precursor. In some embodiments, the flow of the oxygen precursor into the process chamber starts at the beginning of the pulse and terminates at the end of the pulse. In some embodiments, the pulse duration may be about 1 second or more, or about 10 seconds or more. In some embodiments, the pulse duration may be about 1 second to about 90 seconds, about 3 second to about 60 seconds, or about 3 seconds to about 30 seconds. When using ozone, the pulse duration may be between 1 and 30 seconds, and in an example process a pulse duration of 5 seconds was used. It will be appreciated that reactive species may removed from the process chamber after block 130. The removal may be accomplished by evacuation of the process chamber and/or flowing purge gas through the process chamber.

Figure 2:
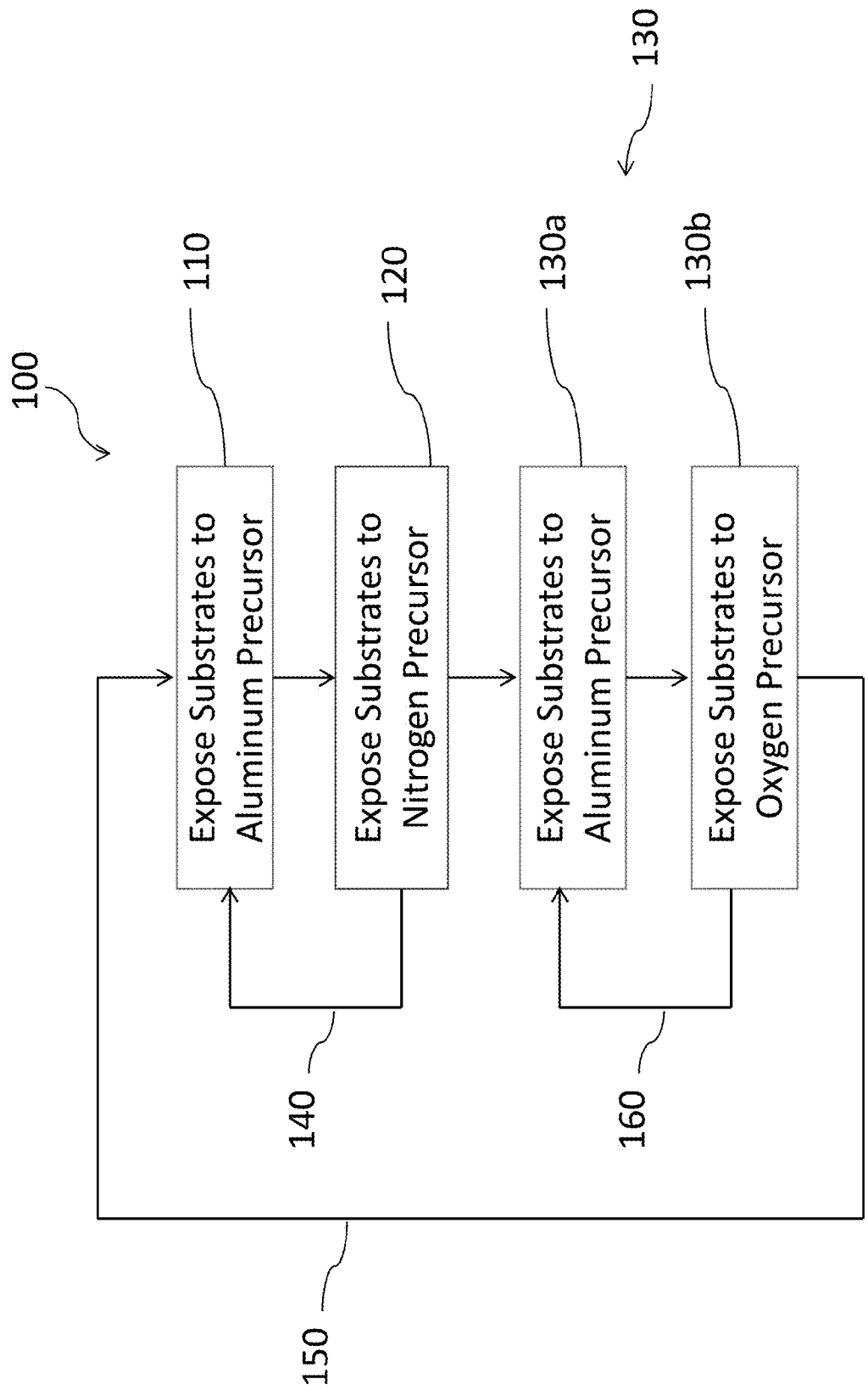
FIG. 2 is a flow chart generally illustrating a process for forming an AlON film, according to some other embodiments.

With reference to FIG. 2, the provided flow chart generally illustrates a process for forming an AlON film according to some other embodiments. FIG. 2 is similar to FIG. 1, except for the oxygen exposure block 130. As illustrated, exposing the substrates to an oxygen precursor may involve exposing the substrates to the oxygen precursor as part of an AlO deposition cycle. Thus, the block 130 may include a block 130*a* in which the substrates are exposed to an aluminum precursor, and a subsequent block 130*b* in which the substrates are exposed to the oxygen precursor. The aluminum precursors and related pulse details may be as discussed above regarding block 110 in FIG. 1. The oxygen precursors and related pulse details may be as discussed above regarding block 130 in FIG. 1. In some embodiments, the same precursors are used throughout the deposition 100, including for example using the same aluminum precursor during blocks 110 and 130*a*. In some other embodiments, it is contemplated that the precursor used to provide a particular element may change over the course of the deposition. It will be appreciated that precursors may be removed from the process chamber after blocks 130*a* and 130*b*. The removal may include evacuation of the process chamber and/or flowing purge gas through the process chamber. As illustrated, the exposure to the aluminum precursor at block 130*a* and the exposure to the oxygen precursor at block 130*b* constitute an AlO deposition cycle 160, which may be repeated in some embodiments. For example, the AlO deposition cycle 160 may be performed 1, 2, 3, or 4 times per AlON deposition cycle 150.

It will be appreciated that the AlN deposition cycles 140 and the subsequent oxygen exposure at block 130 may be repeated to deposit an AlON film of a desired thickness. The AlN deposition cycles 140 and the oxygen exposure at block 130 may be referred to together as an AlON deposition cycle. In some embodiments, 50 or more, or 100 or more AlON deposition cycles may be performed. It will be appreciated that where the oxygen exposure 130 includes the AlO deposition cycles 160, the AlO deposition cycles 160 and the AlN deposition cycles 140 form a laminate of AlN and AlO sublayers, which form an AlON film in the aggregate.

As discussed herein, the ratio of the block 130 oxygen exposures to the AlN deposition cycles 140 may be varied to tune the properties of the resulting AlON film. It has been found that AlN is prone to oxidation during the oxygen exposure of block 130 and, at ratios of more than about 1:6, the AlN film may be converted to a film that is substantially AlO. Consequently, to form an AlON film, the ratio of the block 130 oxygen exposures to the AlN deposition cycles 140 (block 130:block 140) is preferably about 1:6 or less, including about 1:10 or less. It will be appreciated that, by varying the ratio of the block 130 oxygen exposures to the AlN deposition cycles 140, the ratio of oxygen exposures to nitrogen exposures can effectively be set. It will be appreciated that these ratios apply to the embodiments of both FIGS. 1 and 2. For example, the ratio of AlO cycles 160 to AlN cycles 140 is preferably about 1:6 or lower, or about 1:10 or lower.

Figure 3:
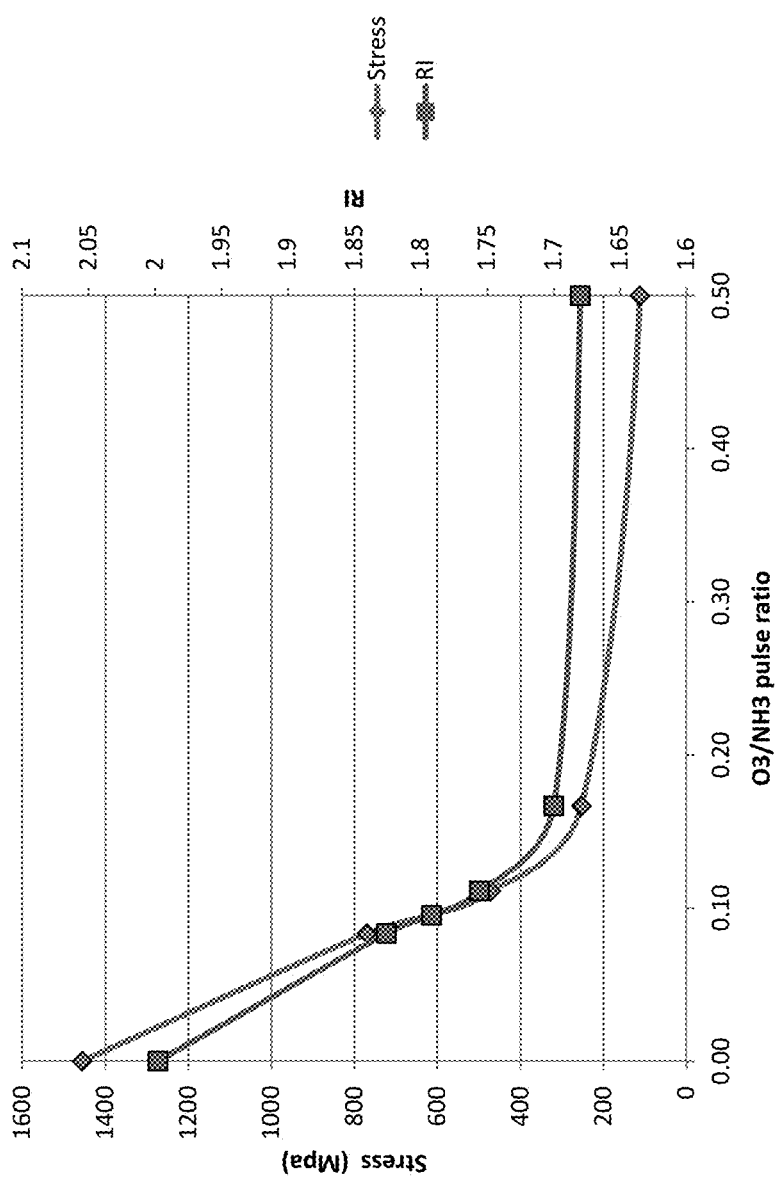
FIG. 3 is a chart showing film stress and refractive index as a function of oxygen to nitrogen precursor ratio, according to some embodiments.

Advantageously, varying these ratios allows the properties of the AlON film to be tuned. For example, the refractive index, phase, stress, and current leakage of the film may be adjusted. FIG. 3 is a chart showing film stress and refractive index as a function of oxygen to nitrogen precursor ratio, according to some embodiments. The incorporation of oxygen in the AlON film decreased both film stress and refractive index. As illustrated, film stress and refractive index were found to decrease with increasing ratios of oxygen precursor exposures to nitrogen precursor exposures. In some embodiments, the film stress is about 800 MPa or less, about 700-100 MPa, or about 500-100 MPa for AlON layers with a thickness of about 20 nm.

Figure 4:
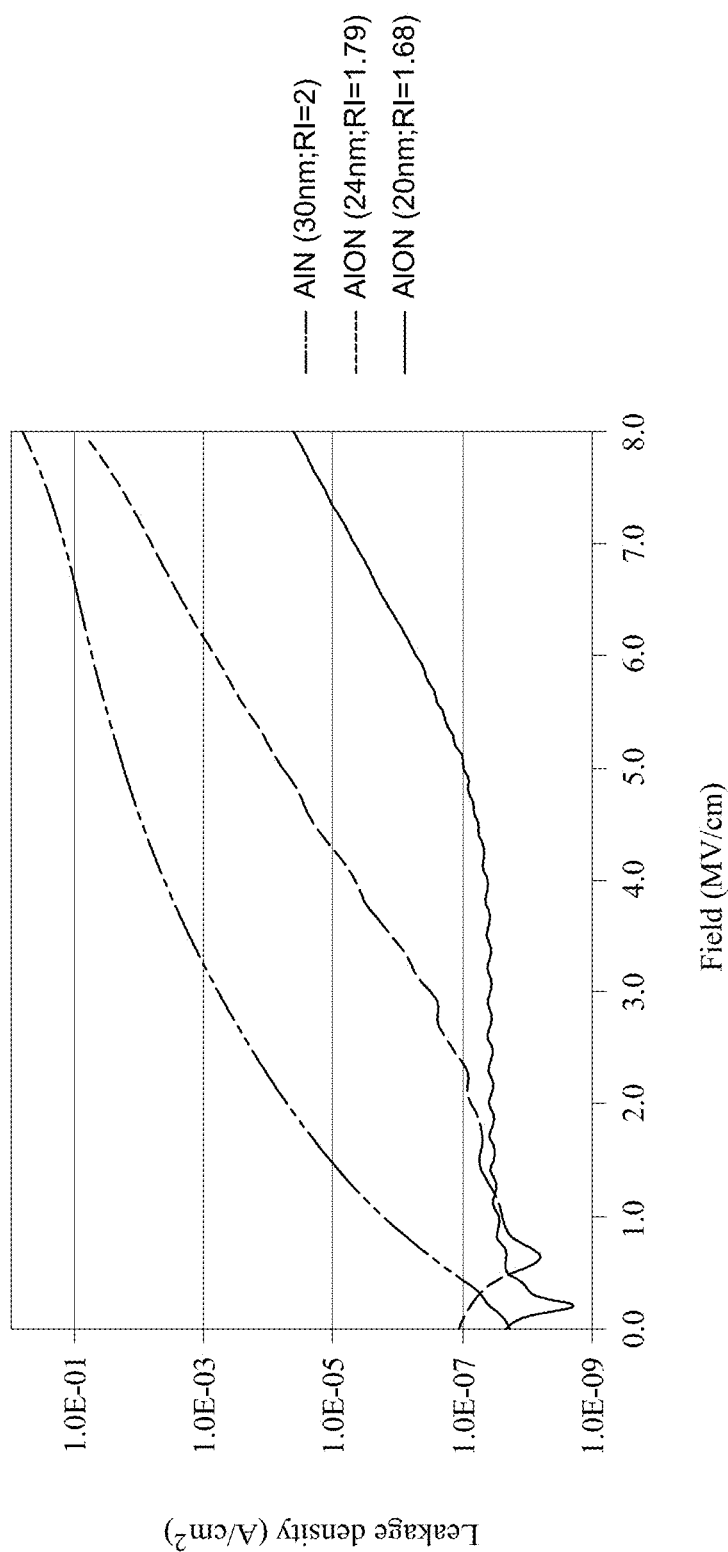
FIG. 4 is a chart showing leakage current density as a function of applied electric field, according to some embodiments.

FIG. 4 is a chart showing leakage current density as a function of applied electric field, according to some embodiments. The AlON films were formed using AlN and AlO deposition cycles as described herein. TMA was the aluminum precursor, ammonia was the nitrogen precursor, and ozone was the oxygen precursor. The lines corresponding to RI=1.79 and RI=1.68 show the leakage current for an AlON film formed using ratios of AlO to AlN deposition cycles of 2:21, and 2:12, respectively. As illustrated, it was found that the incorporation of oxygen in an AlON film caused a decrease in leakage current density relative to an AlN film. In addition, increasing levels of oxygen incorporation, as determined based on the ratio of oxygen precursor exposure to nitrogen precursor exposure, were found to decrease leakage current density. For example, a leakage current density of less than about $1 \times 10^{-7}$ A/cm$^2$ with an applied electric field of about 2 mV/cm was achieved with a ratio of 1:10 or lower, and a leakage current density of about $1 \times 10^{-7}$ A/cm$^2$ with an applied electric field of about 4 mV/cm was achieved with a ratio of 1:6 or lower.

In addition, the oxygen in the AlON film can suppress crystallinity, thereby allowing formation of an amorphous AlON film. It will be appreciated that the fraction of the AlON film that is crystalline can increase with increasing thickness. The incorporation of oxygen in the film allows the formation of relatively thick AlON layers that are amorphous.

Advantageously, the tunability of AlON film allows the film to be used in various applications. For example, the low stress of the AlON film allows the film to be deposited on relatively weak, or soft, materials. Examples of such soft materials include materials deposited by spin-coating, such as photoresist. Advantageously, the low stress allows the AlON film to be deposited on the underlying material, without, e.g., delaminating.

The AlON film can provide excellent etch selectivity, with a low etch rate when exposed to fluorine-based etch chemistries. In some embodiments, the etch rate of the AlON film when exposed to fluorine-based etch chemistries is between that of aluminum nitride and aluminum oxide. Advantageously, the AlON film can be utilized as a hard mask. In some applications, the AlON film may be an etch stop, such as when fluorine-based etch chemistries are used to etch overlying materials. In some applications, the AlON film may be patterned and then used as an etch mask to pattern underlying material. Advantageously, in some embodiments, the AlON film may be retained as part of a final integrated circuit structure. For example, the AlON film may be used as a dielectric film in the integrated circuit. In an embodiment, the ratio of oxygen exposures to AlN deposition cycles may be varied during the film deposition process. For example, during the initial phase of the deposition process on a relatively soft material (e.g., photoresist), a relatively high ratio of oxygen exposures (relative to the oxygen exposures during the final phase below) may be applied resulting in an oxygen rich film having a low stress, whereas during a final phase of the film deposition process a relatively low ratio of oxygen exposures (relative to the oxygen exposures during the initial phase above) may be applied, resulting in an oxygen poor film having a low etch rate when exposed to fluorine-based etch chemistries.

As noted above, the AlON deposition 100 (FIGS. 1 and 2) is preferably a thermal deposition in which the deposition is performed without exposing the substrates to plasma. Advantageously, by not exposing the film to plasma, electrical defects, such as trapped charges, can be avoided.

The thermal deposition of the AlON film includes the thermal deposition of AlN, without the use of plasma during the deposition. The thermal deposition of AlN has been considered challenging. Thermal deposition of AlN has been suggested by T. M. Mayer, J. W. Rogers and T. A. Michalske, Chem. Mater. 1991, 3, 641-646, "Mechanism of Nucleation and Atomic Layer Growth of AlN on Si"). However, attempts at atomic layer deposition of AlN films have not provided deposited films that are uniform across a substrate, even in state-of-the-art single wafer reactors used in the semiconductor processing industry. Thus, these thermal depositions have been considered unsuccessful due to the unacceptably poor film uniformities that are produced.

Without being limited by theory, it is believed that the above-noted attempts at atomic layer deposition produced non-self-limiting and uncontrolled deposition over at least some parts of the substrate, thereby causing large variations in film thickness across the substrate. Thus, while atomic layer growth having a roughly monolayer by monolayer deposition of AlN was desired, the depositions appeared to in fact contain a strong chemical vapor deposition component in which film growth was not self-limited. As a result, the controllability of the thermal deposition has been considered poor and insufficient for depositions across a substrate, particularly in comparison to results achievable with plasma-assisted depositions.

Without being limited by theory, it is believed that the deposition pressures typically utilized in single wafer reactors may encourage undesired reactions between aluminum precursors, thereby causing non-self-limited deposition of aluminum on a substrate. Typical single wafer reactor deposition pressures may be in the range of 1 to 10 Torr. According to some embodiments, the deposition pressure is about 50 mTorr to about 900 mTorr, about 100 mTorr to about 700 mTorr, or about 150 mTorr to about 550 mTorr, which may reduce the non-self-limiting component of the AlN deposition. In conjunction with relatively long precursor pulse durations of, e.g., 1 or 3 seconds or more, the low pressures allow good saturation of the substrate surface with the precursor, while providing low levels of non-self-limited deposition. It will be appreciated that absorbed precursors on the walls or incompletely reacted deposits on the walls of the process chamber can adversely affect the deposition and may generate contaminants. Without being limited by theory, it is believed that the use of a hot wall batch process chamber can reduce the amount of poor quality deposits on the chamber walls, thereby improving the quality of films deposited on the substrates.

The deposition of highly uniform AlN films advantageously allows for the formation of highly uniform AlON films. The deposition of AlN films was investigated and is discussed below.

EXAMPLES

AlN films were deposited in a A412 vertical furnace commercially available from ASM International, Versterkerstraat 4, 1322 AP Almere, the Netherlands. The furnace has a linerless process chamber, aluminum and nitrogen precursors were injected into the process chamber, each gas flowing through a separated multiple hole injector. Purge gas may be injected through the multiple hole injectors and/or through a "dump" injector, which is an injector tube without intermediate holes but having an open end near the top of the process tube. The gases are evacuated at the bottom of the process tube. Substrates are accommodated in a rack, or "boat," which may be rotated during depositions inside the process chamber. The process chamber is a hot wall chamber.

Trimethylaluminum (TMA) was used as the aluminum precursor and $NH_3$ as the nitrogen precursor. Unless otherwise specified, the depositions were performed at 350° C., 70 cycles of deposition were performed, boat rotation was applied, and the following cycle was performed:

|  | Flow rate, Gas flowed | Duration |
| --- | --- | --- |
| TMA pulse: | 0.4 g/min TMA | 7 s |
| TMA purge: | 5 slm $N_2$ | 7 s |
| $NH_3$ pulse: | 1 slm $NH_3$ | 30 s |
| $NH_3$ purge: | 5 slm $N_2$ | 30 s |

During the purge steps, the 5 slm $N_2$ was injected through the dump injector. Additional small $N_2$ flows were flown through the multiple hole injectors. The chamber pressure was not controlled but maximum pumping and evacuation of the chamber was simultaneously applied, resulting in a chamber pressure in a range of 150 to 550 mTorr. The pressure of 150 mTorr is the pressure during the precursor exposure steps and the pressure of 550 mTorr is the pressure during the purge steps.

Figure 5:
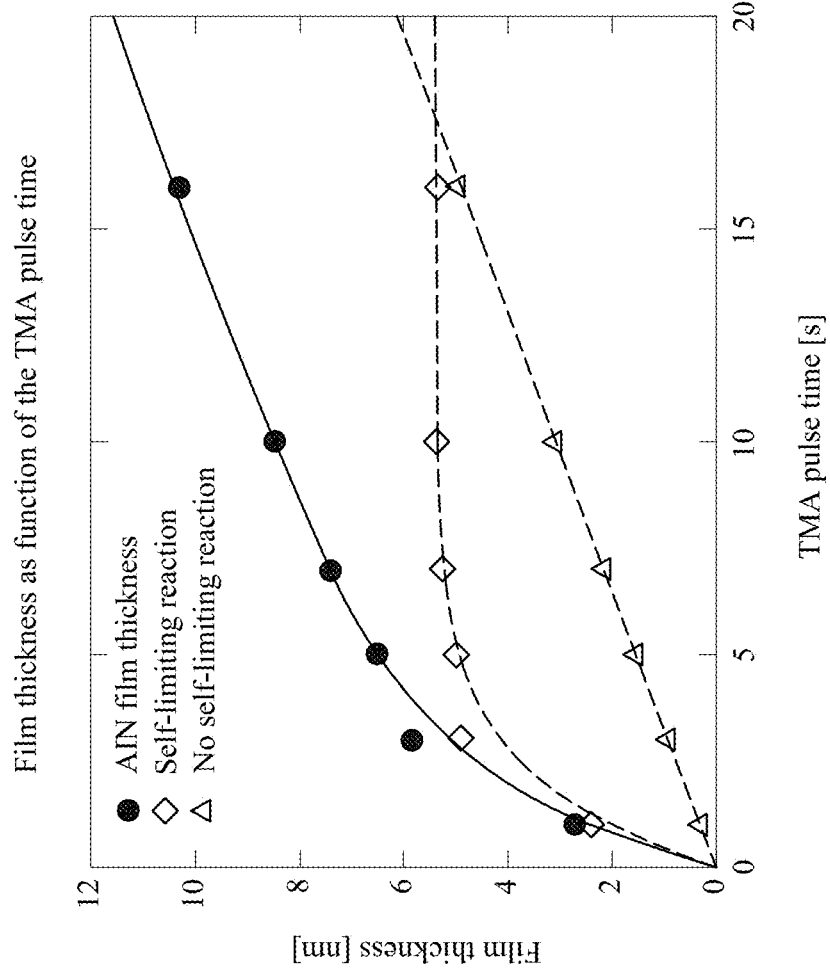
FIG. 5 is a chart showing deposited film thickness as a function of TMA pulse duration, according to some embodiments.

FIG. 5 is a chart showing deposited film thickness as a function of TMA pulse duration, for 70 cycles at a deposition temperature of 350° C. From the chart it can be observed that the film thickness did not saturate with increasing TMA pulse duration. Rather, increasing pulse durations provided increasing AlN film thicknesses. Thus, it is believed that the AlN deposition process is not completely self-limiting as would occur with pure ALD. Rather, the AlN deposition contains a self-limiting component (open diamonds) and a non-self-limiting component (open triangles). The self-limiting component is evident at a TMA pulse duration of 3 second or longer. For TMA pulse durations of 16 seconds, the contribution of the non-self-limiting component and the self-limiting component to the deposited film thickness are about equally large. A TMA pulse duration of about 7 seconds was found to provide good deposition rates and high uniformity.

Figure 6:
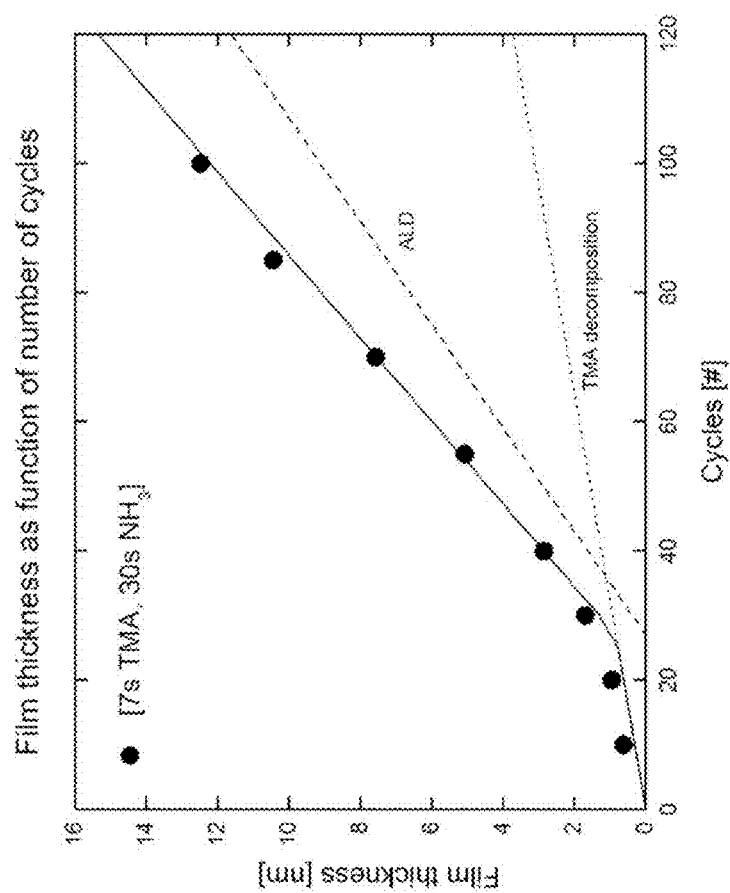
FIG. 6 is a chart showing deposited film thickness as a function of the number of deposition cycles performed, according to some embodiments.

FIG. 6 is a chart showing deposited film thickness as a function of the number of deposition cycles performed. Notably, over the first 30 to 40 cycles, the effective deposition rate is relatively low, with 0.31 Ang/cycle, and then the self-limiting component of 1.25 Ang/cycle is fully developed and the total deposition rate increases to 1.56 Ang/cycle. The low initial deposition rate is believed to be due to the self-limiting component of the AlN being inflicted with an initial inhibition period.

Figure 7:
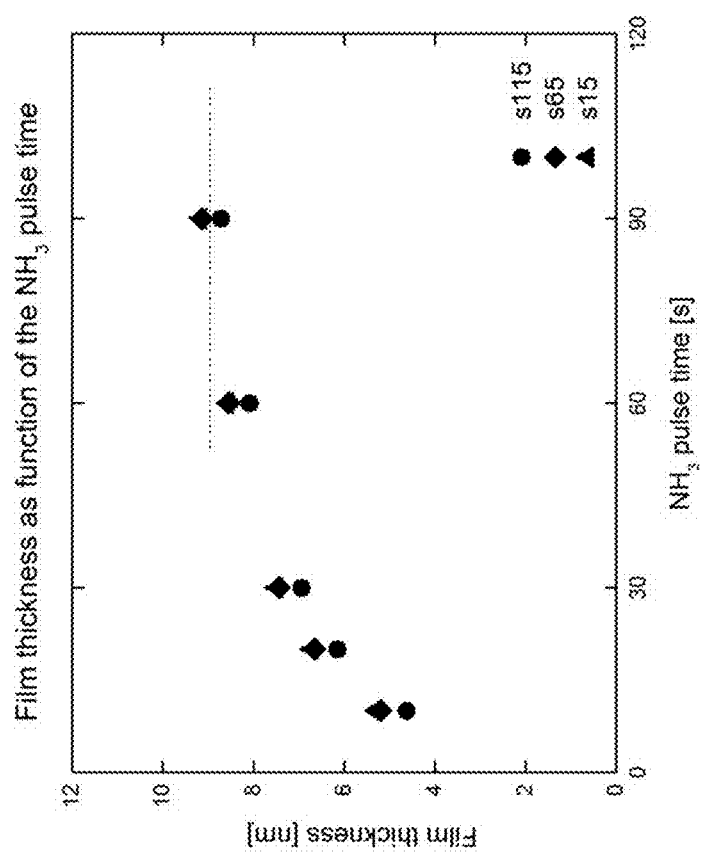
FIG. 7 is a chart showing deposited film thickness as a function of $NH_3$ pulse duration, according to some embodiments.
Figure 8:
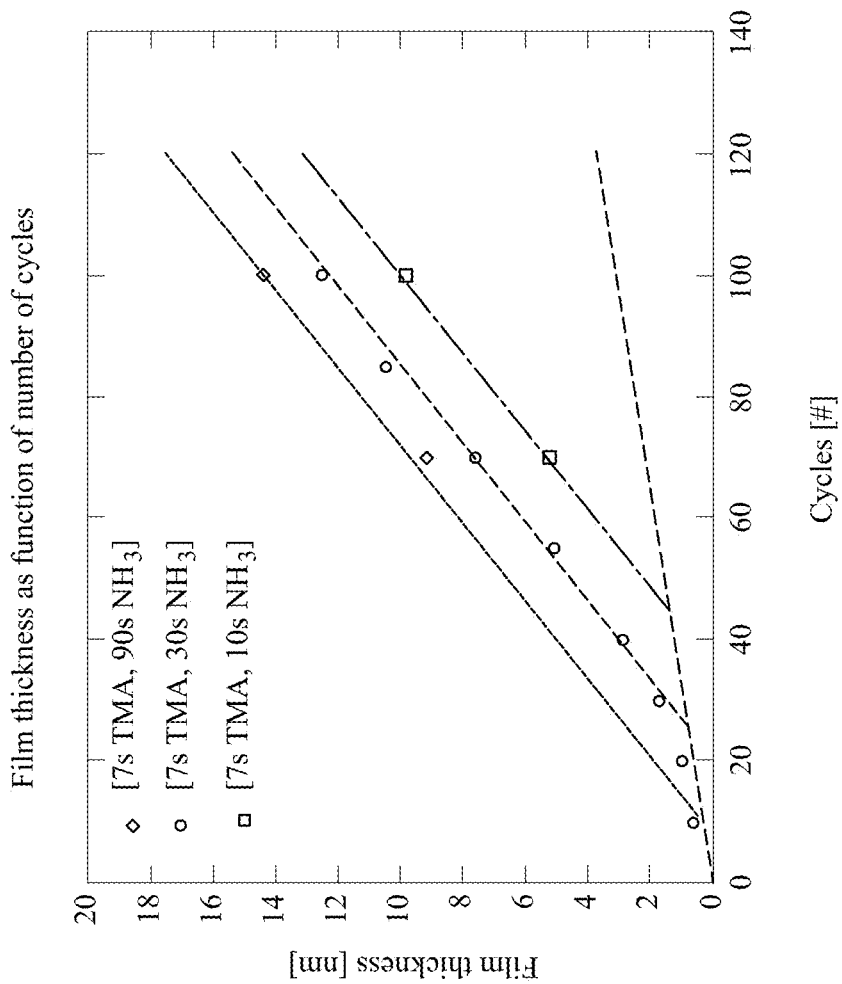
FIG. 8 is a chart showing deposited film thickness as a function of the number of deposition cycles, for various $NH_3$ pulse durations, according to some embodiments.

FIG. 7 is a chart showing deposited film thickness as a function of $NH_3$ pulse duration (for 70 cycles of deposition at 350° C.). The increase in deposited film thickness with increasing $NH_3$ pulse duration can be understood with the help of FIG. 8, showing the film thickness for three wafers at different wafer positions: S15, S65 and S115 are substrates in respectively the bottom, center and top region of the process chamber. It will be appreciated that the triangles and diamonds in the chart substantially overlap, demonstrating good uniformity of the film thickness over the furnace.

FIG. 8 is a chart showing deposited film thickness as a function of the number of deposition cycles, for various $NH_3$ pulse durations. The various $NH_3$ pulse durations were 10, 30, and 90 seconds. It was found that the inhibition period for the self-limiting deposition decreases with increasing $NH_3$ pulse duration. The inhibition period was about 10, about 30, and about 45 cycles for $NH_3$ pulse durations of 90, 30, and 10 seconds, respectively. This resulted in a higher effective deposition rates for longer $NH_3$ pulse durations. However, when the inhibition period was passed, the deposition rate per cycle was substantially equal for all $NH_3$ pulse durations. This indicates that even for the 10 second $NH_3$ pulse duration, fully self-limiting deposition had been obtained. It is contemplated that an $NH_3$ pulse duration of 3 seconds is adequate to obtain fully saturated, self-limiting deposition after passing the inhibition period.

Figure 9:
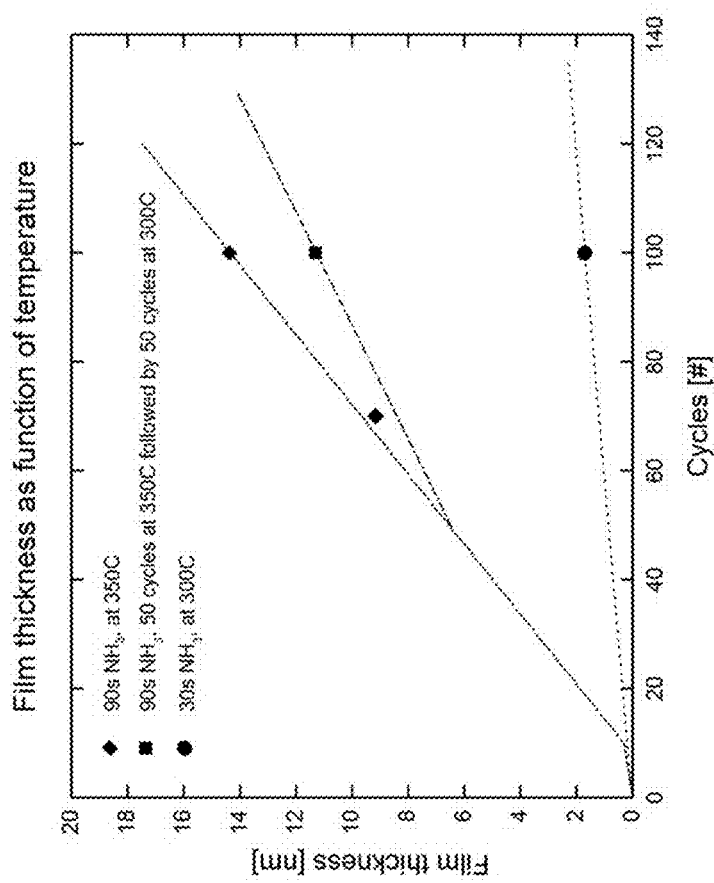
FIG. 9 is a chart showing deposited film thickness as a function of the number of deposition cycles, for different deposition temperatures, according to some embodiments.

FIG. 9 is a chart showing deposited film thickness as a function of the number of deposition cycles, for different deposition temperatures. Most depositions were performed at 350° C. At this temperature, 100 cycles resulted in a film thickness of about 14 nm. When the deposition temperature was lowered to 300° C., 100 cycles resulted in a film thickness of only about 2 nm. However, when the first 50 cycles were performed at 350° C., and then the deposition was continued at a lower temperature of 300° C., only a slight decrease in film thickness, to 11 nm, was observed. It is believed that, at the lower temperature, the inhibition period is substantially longer, resulting in a lower final film thickness. Once a closed AlN was formed, however, the deposited film thickness per cycle is only slightly dependent on the deposition temperature. Thus, it is believed that the surface plays a role in the decomposition of the precursor and the film formation process. These results indicate that a useful range of deposition temperatures for TMA is from about 300° C. to about 375° C. At temperature above 375° C. it is expected that the decomposition rate of TMA becomes so large that the process may no longer be controlled adequately.

Figure 10:
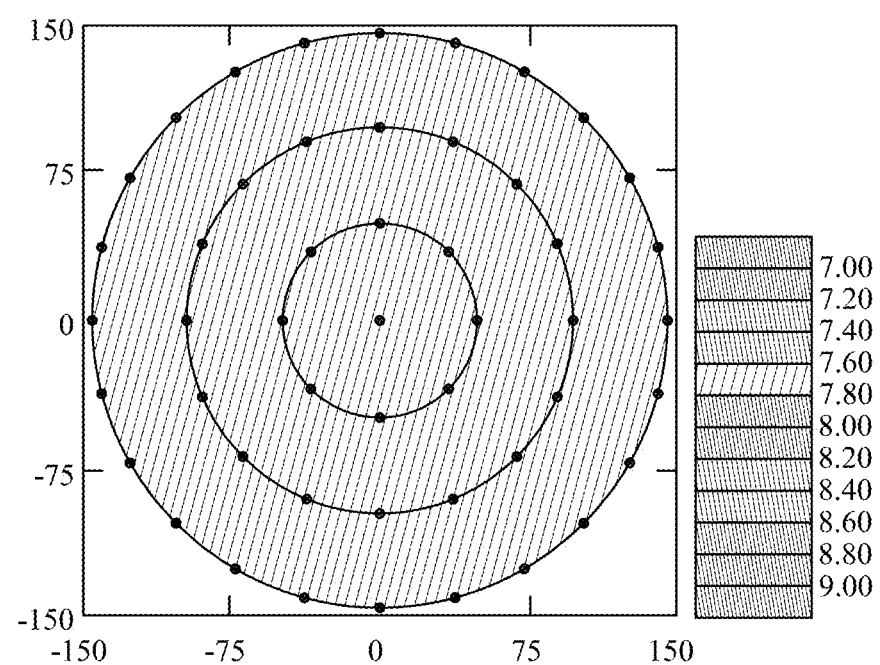
FIG. 10 shows the uniformity of a deposited AlN film, according to some embodiments.

FIG. 10 shows the uniformity of a deposited AlN film. The deposition conditions for this film were as described above were as described above under the example. The AlN film was found to be very uniform, having a film non-uniformity of σ=0.25% across the substrate. The good uniformity is believed to indicate that the process was strongly surface-controlled. Such surface control is typically associated with a self-limiting process, but here the process had a non-self-limiting component, which made a significant contribution to the deposited film thickness. Nevertheless, the deposition process advantageously provided good surface control of the deposition.

The influence of the purge time on film uniformity was also evaluated. For the TMA purge step, times ranging from 1 seconds to 7 seconds were applied and no influence on the film uniformity was noticed. For the NH$_3$ purge step, purge times ranging from 3 seconds to 30 seconds were applied. For the three shortest purge times (3, 5, and 7 seconds), a significantly higher non-uniformity was observed than for purge times of 15 and 30 seconds, with the highest non-uniformity for the 3 second purge time and the non-uniformity gradually decreasing for the 5 and 7 second purge times. It is contemplated that NH$_3$ purge times of 7 seconds or more, and more preferably 15 seconds or more have advantages for forming highly uniform AlN films.

Although the above noted examples were performed with TMA, it is contemplated that other organic aluminum precursors would provide similar advantageous results. Such precursors are disclosed above, and can include, for example, aluminum alkyl precursors or alkyl-substituted aluminum chlorides or hydrides that have sufficient volatility and a decomposition temperature similar to TMA. Table 1 provides examples of some precursors.

| Al Precursor | Vapor Pressure (Torr) | Al Growth Temp. (° C.) |
|---|---|---|
| Trimethylaluminum (TMA) (CH$_3$)$_3$Al | 11 @ 20° C. | 300 |
| Triethylaluminum (TEA) (CH$_3$CH$_2$)$_3$Al | 0.1 @ 36° C. | 160 |
| Triisobutylaluminum (TIBA) [H(CH$_3$)$_2$CCH$_2$]$_3$Al | 0.1 @ 27° C. | 250 |
| Diethylaluminum chloride (DEACl) CH$_3$CH$_2$)$_2$AlCl | 3 @ 60° C. | 340 |
| Dimethylaluminum hydride (DMAH) (CH$_3$)$_2$AlH | 2 @ 25° C. | 240 |
| Tritertiarybutylaluminum [(CH$_3$)$_3$C]$_3$Al | | 300-400° C. |

It will be appreciated by those skilled in the art that various modifications and changes can be made without departing from the scope of the invention. Similar other modifications and changes are intended to fall within the scope of the invention, as defined by the appended claims.

What is claimed is:

1. A method for integrated circuit fabrication, comprising:
   forming an AlON film on a substrate, wherein forming the AlON film comprises:
   performing a plurality of aluminum and nitrogen deposition cycles to form an aluminum and nitrogen-containing compound, each cycle comprising:
   exposing the substrate to an aluminum precursor; and
   subsequently exposing the substrate to a nitrogen precursor;
   subsequently exposing the aluminum and nitrogen-containing compound to an oxygen precursor; and
   repeating performing the plurality of aluminum and nitrogen deposition cycles and subsequently exposing the aluminum and nitrogen-containing compound to an oxygen precursor.

2. The method of claim 1, wherein exposing the aluminum and nitrogen-containing compound to the oxygen precursor comprises:
   exposing the substrate to an aluminum precursor; and
   subsequently exposing the substrate to the oxygen precursor.

3. The method of claim 2, wherein the aluminum precursor for the aluminum and nitrogen deposition cycles is the same as for exposing the aluminum and nitrogen-containing compound to the oxygen precursor.

4. The method of claim 1, further comprising, after exposing the substrate to oxygen, performing an other plurality of the aluminum and nitrogen deposition cycles.

5. The method of claim 1, wherein performing the plurality of aluminum and nitrogen deposition cycles and exposing the aluminum and nitrogen-containing compound constitute an AlON deposition cycle, further comprising performing a plurality of AlON deposition cycles.

6. The method of claim 1, wherein forming an AlON film on a substrate comprises forming the AlON film directly on a spin-coated material.

7. The method of claim 6, wherein the spin-coated material is photoresist.

8. The method of claim 1, further comprising:
   patterning the AlON film; and
   etching the substrate through the patterned AlON film.

9. The method of claim 1, wherein performing the plurality of aluminum and nitrogen deposition cycles and exposing the substrate to oxygen is conducted in a hot wall batch process chamber.

10. The method of claim 9, wherein the batch process chamber is configured to accommodate 25 or more substrates.

11. The method of claim 1, wherein a stress of the AlON film is about 200-700 MPa.

12. The method of claim 1, wherein the AlON film is amorphous.

13. A method for integrated circuit fabrication, comprising:
   subjecting a substrate to a plurality of temporally separated exposures to each of an aluminum precursor and a nitrogen precursor to form an aluminum and nitrogen-containing compound on the substrate;
   subsequently exposing the aluminum and nitrogen-containing compound to an oxygen precursor; and
   repeating subjecting the substrate and subsequently exposing to form an AlON film.

14. The method of claim 13, wherein an exposure to the aluminum precursor and an exposure to the nitrogen precursor constitutes a AlN deposition cycle, wherein subjecting the substrate comprises performing six or more AlN deposition cycles for every exposure to the oxygen precursor.

15. The method of claim 14, wherein subsequently exposing comprises:
   subjecting the substrate to temporally separated exposures to an aluminum precursor and the oxygen precursor.

16. The method of claim 15, wherein subjecting the substrate to temporally separated exposures to the aluminum precursor and the oxygen precursor comprises exposing the substrate to a single exposure of the aluminum precursor and a single exposure of the oxygen precursor before repeating subjecting the substrate and subsequently exposing.

17. The method of claim 14, wherein the aluminum precursor comprises TMA.

18. The method of claim 17, wherein the aluminum precursor for subsequently exposing the substrate to oxygen comprises TMA.

19. The method of claim 13, wherein the substrate is not exposed to plasma during subjecting the substrate to temporally separated exposures or during subsequently exposing the aluminum and nitrogen-containing compound.

20. The method of claim 13, wherein the nitrogen precursor comprises ammonia.

21. The method of claim 13, wherein oxygen precursor comprises water, oxygen gas, or ozone.

* * * * *